United States Patent
Alpert et al.

(10) Patent No.: US 7,020,861 B2
(45) Date of Patent: Mar. 28, 2006

(54) LATCH PLACEMENT TECHNIQUE FOR REDUCED CLOCK SIGNAL SKEW

(75) Inventors: Charles Jay Alpert, Round Rock, TX (US); Gary Robert Ellis, Austin, TX (US); Gi-Joon Nam, Austin, TX (US); Paul Gerard Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 10/621,950

(22) Filed: Jul. 17, 2003

(65) Prior Publication Data

US 2005/0015738 A1    Jan. 20, 2005

(51) Int. Cl.
*G06F 17/50*    (2006.01)
(52) U.S. Cl. ............... 716/6; 716/8; 716/9; 716/10; 716/12
(58) Field of Classification Search ............... 716/6–14
See application file for complete search history.

(56) References Cited

U.S. PATENT DOCUMENTS 6,440,780 B1 * 8/2002 Kimura et al. ............... 716/12
6,442,739 B1 * 8/2002 Palermo et al. ............... 716/6

* cited by examiner

*Primary Examiner*—Paul Dinh
(74) *Attorney, Agent, or Firm*—Joseph P. Lally; Casimer K. Salys

(57) ABSTRACT

A method of designing an integrated circuit including executing a placement algorithm to place a set of objects within the integrated circuit. The set of objects includes latched objects and non-latched objects. The algorithm places objects to minimize clock signal delay subject to a constraint on the placement distribution of the latched objects relative to the placement distribution of the non-latched objects. The latched object and non-latched object placement constraints may limit the difference between the latched object center of mass and a non-latched object center of mass. The latched object center of mass equals a sum of size-location products for each latched object divided by the sum of sizes for each latched object. The constraints may require that the latched object center of mass and the non-latched center of mass both equal the center of mass for all objects.

16 Claims, 3 Drawing Sheets

$$\left(\sum_{i \in \text{latched objects}} (size_i)(x_i)\right) \Big/ \left(\sum_{i \in \text{latched objects}} (size_i)\right) = X_u$$

111A $$\left(\sum_{j \in \text{non-latched objects}} (size_j)(x_j)\right) \Big/ \left(\sum_{j \in \text{non-latched objects}} (size_j)\right) = X_u$$

111B

LATCH PLACEMENT TECHNIQUE FOR REDUCED CLOCK SIGNAL SKEW

BACKGROUND

1. Field of the Present Invention

The present invention is in the field of integrated circuit design and more particularly in the area of optimally locating objects within an integrated circuit layout.

2. History of Related Art

The layout of complex integrated circuits is typically achieved with the aid of computer based algorithms. Historically, the primary objective of such algorithms has been to minimize the interconnect (also referred to as a "net") length and thereby minimize capacitive delay and energy loss. Among the most significant interconnect signals in the design of any integrated circuit is the clock tree. A clock tree distributes at least one clock signal from its source, a clock generator, to "sink" pins or clock pins of the circuit's synchronous objects. A circuit's synchronous objects include any objects that are designed to transition from one state to the next during transitions of the clock signal. These objects include latches, flip flops, and so forth.

The design of a circuit's clock tree is important because the clock tree consumes a significant portion of the device's overall power and because the clock tree design dictates limits on the circuit's performance. More specifically, a clock tree's latency and skew determine boundaries or limits on the achievable performance of the circuit. Latency refers to the signal's rise time or the amount of time required to drive the clock net from a first state (e.g. low) to a second state (e.g., high) while the skew refers to the maximum delay difference from the clock source to the various sinks.

The clock tree design is dictated in part by the placement of objects (cells) within the device. There are various algorithms to perform automated or assisted cell placement. One such algorithm, referred to as quadratic optimization, attempts to minimize a weighted sum of interconnect lengths or, more precisely, a weighted sum of squared interconnect lengths. In a conventional placement algorithm, the synchronous or latched objects and the non-latched objects are treated equivalently for purposes of object placement. As a result, conventional placement algorithms may produce a placement pattern in which the latched object placement pattern may be characterized as clustered or asymmetric. Because asymmetric latch placement tends to exhibit more clock skew, it would be desirable to implement a cell placement algorithm or method that produces more symmetrical latched object placement distributions.

SUMMARY OF THE INVENTION

The goal identified above is addressed according to the present invention by a method, system, and software for designing an integrated circuit that includes performing an initial placement algorithm to obtain an initial placement of the integrated circuit's objects having a minimized weighted sum of interconnect lengths unconstrained by considerations of the relative placement of latched and non-latched objects. If the resulting signal skew is unacceptably high, the method further includes executing a placement algorithm to place a set of objects within the integrated circuit. The set of objects includes latched objects and non-latched objects. The algorithm places objects to minimize clock signal delay subject to a constraint on the placement distribution of the latched objects relative to the placement distribution of the non-latched objects. The latched object and non-latched object placement constraints may limit the difference between the latched object center of mass and a non-latched object center of mass. The latched object center of mass equals a sum of size-location products for each latched object divided by the sum of sizes for each latched object. The constraints may require that the latched object center of mass and the non-latched center of mass both equal the center of mass for all objects.

BRIEF DESCRIPTION OF THE DRAWINGS

Other objects and advantages of the invention will become apparent upon reading the following detailed description and upon reference to the accompanying drawings in which.

Figures 1A, 1B:
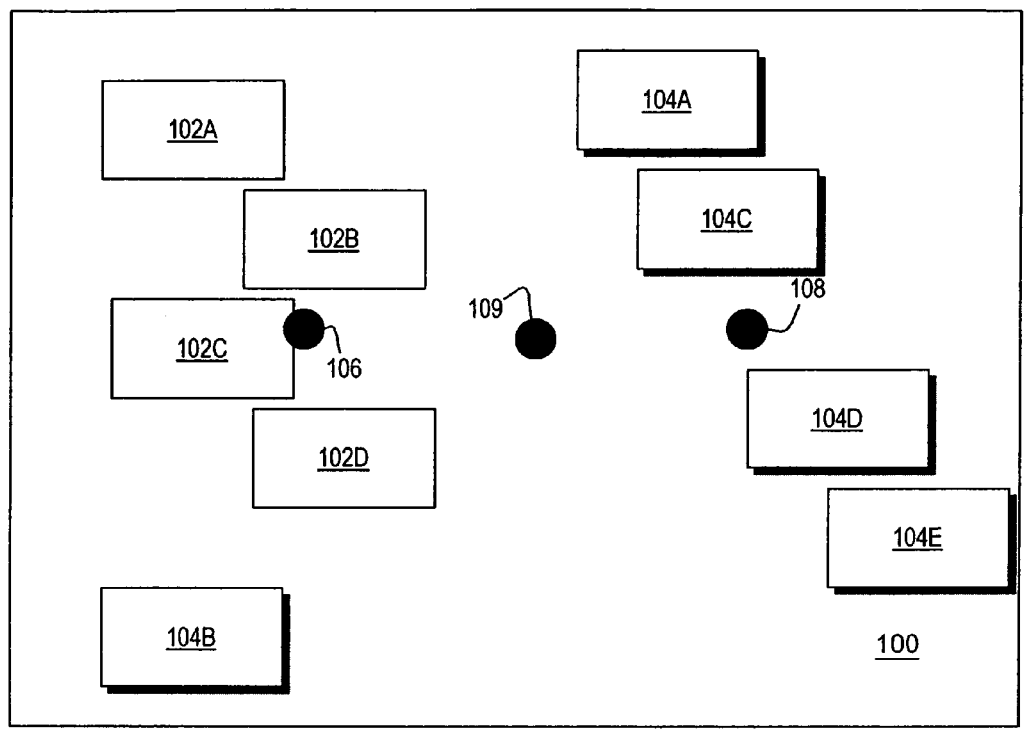
FIG. 1A is a conceptual illustration of cell placement in an integrated circuit achieved by a conventional object placement algorithm.
FIG. 1B is an objective equation used in placing objects in FIG. 1A to minimize clock delay.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present application describes a methodology for placing integrated circuit objects within the integrated circuit to achieve maximum performance by minimizing a delay characteristic associated with the circuit's clock trees while simultaneously minimizing or reducing the trees' clock skew. Initially a cell placement algorithm concerned exclusively with delay minimization is executed. The resulting placement is then subjected to scrutiny based upon a measure of the clock tree skew the circuit is likely to exhibit. If this measure of skew is unsatisfactory, a second placement algorithm is executed. The second algorithm refines the cell placement based on both delay minimization and additional clock-related constraints. The additional constraints reduce the resulting clock skew by placing objects with a consideration towards uniform or symmetric distribution of latch elements about the clock generator. In this manner, the clock tree is balanced among the various clock sinks and the resulting clock skew is reduced thereby improving the potentially achievable performance of the device.

Referring now to FIG. 1A, a conceptual illustration of selected elements of an integrated circuit produced by a conventional cell placement technique is illustrated to provide a point of comparison. In FIG. 1A, an integrated circuit 100 is represented by a set of integrated circuit cells or objects. The depicted objects are classified as non-latched objects 102A through 102D (generically or collectively non-latched object(s) 102) and latched objects 104A through 104E (latched object(s) 104). As alluded to above, latched objects 104 include the circuit's synchronous elements, which receive a clock signal input that defines the transition from one state or output value of the element to the next. Non-latched objects 102 include combinational logic elements such as AND, OR, NAND, NOR, and EXOR gates. The output values of these elements change simultaneously with input changes (ignoring propagation delays). The elements of integrated circuit are classified as latched and non-latched for purposes of this disclosure because it is the latched objects that determine the performance characteristics of the clock(s) trees. It will be appreciated of course that a typical integrated circuit has a far greater number of such objects than integrated circuit 100 as depicted in FIG 1A.

A representative placement algorithm used to achieve the global cell placement depicted in FIG. 1A is characterized by its ability to minimize the quantity $\phi(x)$ of equation 101 of FIG. 1B. Qualitatively, $\phi(x)$ is indicative of the cumulative length (in the x-axis direction) of the nets that interconnect the various objects (both latched and non-latched) of circuit 100. An analogous effort is undertaken with respect to the y-axis direction. The placement of objects 102 as depicted in FIG. 1A illustrates that, while all objects as a whole (i.e., latched and non-latched objects) are distributed in a symmetric fashion about a "center of mass" point 109, the latched objects 104, as a separate group, are asymmetrically distributed about point 109. This asymmetrical placement of latched objects is emphasized by the displacement between the latched object center of mass point 108, which represents the point (in the x-axis direction) about which the latched objects 104 are evenly distributed, and the non-latched object center of mass point 106. Traditional cell placement algorithms are capable of producing such asymmetric distributions of latched and non-latched objects because traditional cell placement algorithms tend not to distinguish between latched and non-latched objects.

Thus, while traditional algorithms may succeed in achieving a symmetric distribution of all objects taken together, they do not check for and thus do not protect against a strongly biased or clustered distribution of latched objects within the circuit. A clustered distribution of latched objects tends to produce a worst case clock tree skew because, while most of the latched objects are within a contained area, an inevitable few latched objects will be located in regions of the circuit that are remote with respect to the clustered region depicted. The resulting disparity in interconnect length from the clock source to the various sink pins produces undesirable clock signal skew.

The present invention addresses unwanted clock signal skew by using a modified placement algorithm that considers the placement positions of latched objects separately from other objects. By segregating the latched objects for placement purposes, the invention is able to achieve a more uniform placement distribution of latched objects and thereby achieving a circuit with a clock tree exhibiting lower clock signal skew. The reduction in clock skew offers the potential for improved performance by reducing the amount of margin designed into the latches.

Figures 2A, 2B:
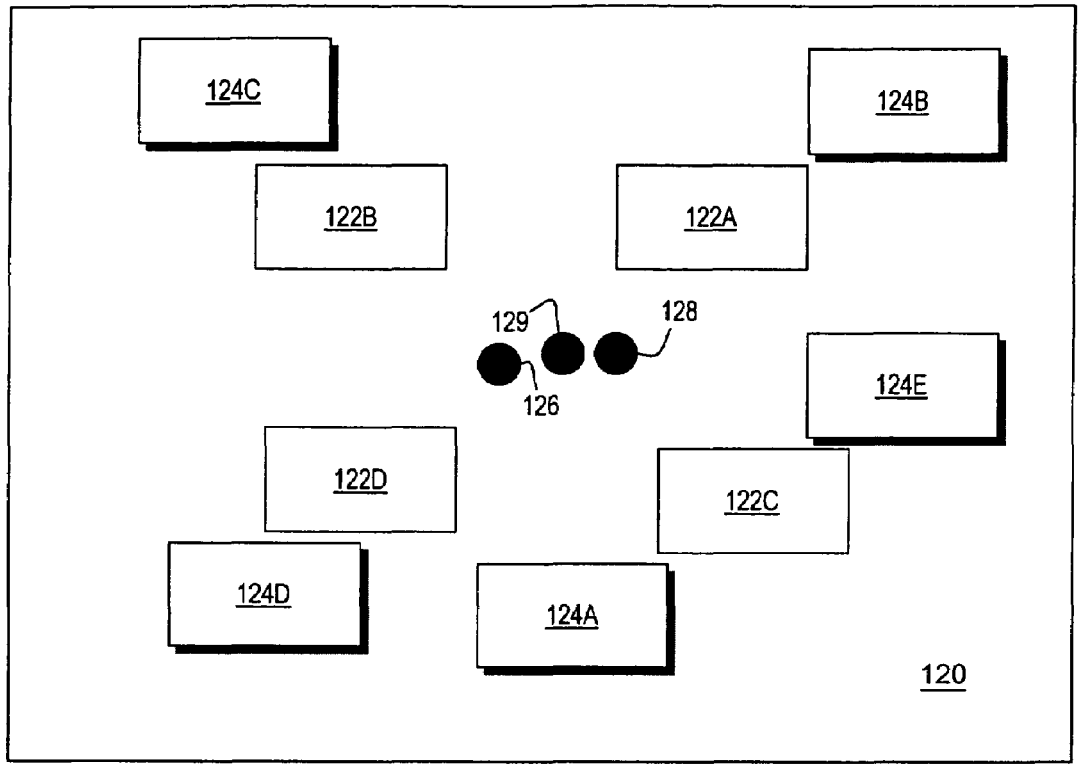
FIG. 2A is a conceptual illustration of cell placement in an integrated circuit achieved by an object placement algorithm according to an embodiment of the present invention.
FIG. 2B are constraint equations used to achieve the placement of objects in FIG. 2A.

Referring to FIG. 2A, a conceptualized depiction of integrated circuit object placement produced by a placement algorithm according to the present invention is shown. In this depiction, an integrated circuit 120 includes latched objects 124A through 124E and non-latched objects 122A through 122D. The placement algorithm used to globally position these objects verifies, after initially placing the objects, that the proposed placement does not result in an unacceptably clustered placement of latched objects. If the symmetry of the latched objects as initially placed is inadequate and the resulting signal skew is unacceptably high, the placement algorithm is re-executed using additional placement constraints that are specific to latched objects and non-latched objects. When the algorithm ultimately completes, the clock tree is optimized for clock signal skew as well as clock signal delay.

As seen in FIG. 2A, the latched object placement has an x-axis center of mass represented by reference numerals 128, the non-latched object placement is characterized by an x-axis center of mass 126, and the collective center of mass is represented by reference numeral 129. Because the latched object placement has been constrained by the placement methodology of the present invention to reduce latched object clustering or asymmetry and because a similar process has been applied to the non-latched objects, the center of mass points 126,128, and 129 are substantially closer to one another than the center of mass points in FIG 1A.

To achieve desirable distribution of integrated circuit elements as represented by the distribution shown in FIG. 2A, one embodiment of the present invention employs a placement algorithm that is enabled to perform a modified quadratic optimization in which both latched object placement and non-latched object placement are constrained by equalities that, when enforced, produce symmetric distribution of the corresponding objects. More specifically, one embodiment of the invention resolves the minimization equation 101 of FIG 1B subject to the object-type specific distribution constraints quantified by equations 111A and 111B.

Equation 101 sums a set of products, where each product represents the length (in the appropriate direction) of a specific net or interconnect multiplied by a weighting factor ($w_{ij}$) where the weighting factor for each net reflects the net's importance or criticality in terms of the circuit's timing. Nets that are critical to achieve desired performance have greater weighting than nets that are of less concern. Equations 111A and 111B calculate a center of mass for latched objects and non latched objects respectively. In the latched object center of mass constraint equation 111A, the latched object center of mass represents the sum of size-location products ($size_i*x_i$) for each latched object divided by the sum of latched object sizes. In this equation, the size of an object ($size_i$) reflects the area required to implement the object, which generally reflects the number of transistors in the object.

Whereas the resolution of equation 101 (without additional constraints) minimizes the weighted sum of the interconnect lengths, resolving equation 101 subject to the constraints of equations 111A and 111B ensures placement that has acceptable delay and skew characteristics by requiring that the latched object center of mass and the non-latched object center of mass are both equal to the center of mass for all objects. Thus, equations 111A and 111B place constraints on the extent of acceptable clustering of latched and non-latched objects.

Figure 3:
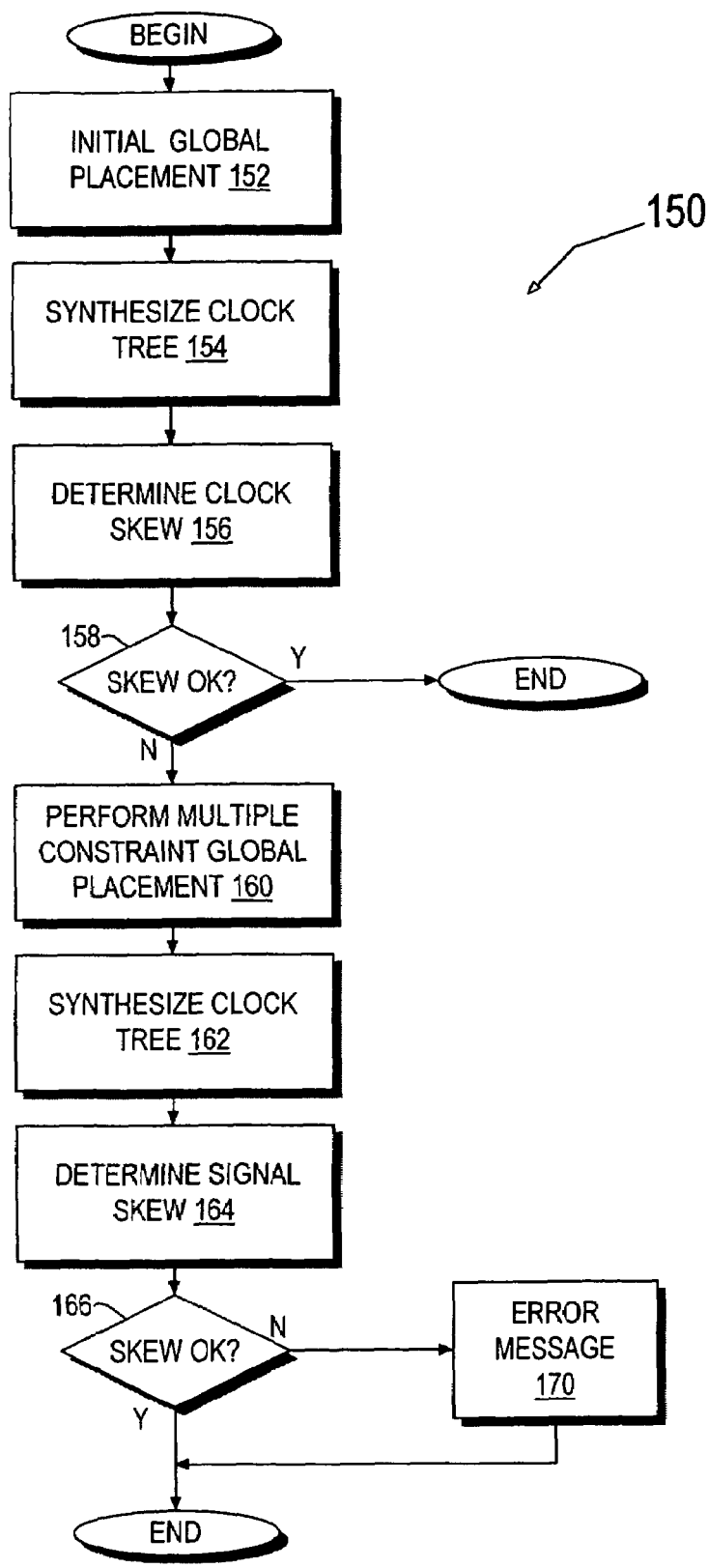
FIG. 3 is a flow diagram of an integrated circuit cell placement method according to one embodiment of the present invention.

Portions of the invention may be implemented as a sequence or set of computer executable instructions (computer software) stored on a computer readable medium such as a hard disk, floppy disk, magnetic tape, CD ROM, flash memory or other electrically erasable storage device, and so forth. The invention also encompasses a data processing system on which the instructions are capable of being executed. When the instructions are actually being executed by a computer processor, the instructions may be stored in a volatile storage device such as the system memory (DRAM) or the processor's internal or external cache memory (SRAM). Referring now to FIG. 3, a flow diagram illustrates a method 150 of integrated circuit object placement according to one embodiment of the present invention. In the depicted embodiment, method 150 begins by executing (block 152) an initial global placement algorithm. The initial algorithm is preferably not subjected to individual constraints on the placement of latched and non-latched objects. Instead, the initial placement algorithm places objects to minimize clock delay (i.e., minimize interconnect lengths) as was described with reference to FIG. 1A. The initial placement algorithm, therefore, may be the quadratic optimization algorithm represented by equation 101 of FIG 1B. An unconstrained minimization algorithm is performed initially because it will produce the placement having the best (least) clock signal delay. If it is subsequently determined that this best case delay placement does not exhibit excessive signal skew because the latch objects happen to have been placed in an adequately symmetric pattern, there is no need to perform additional placement processing.

After the initial placement algorithm is performed, method 150 determines whether the clock-signal skew resulting from the initially determined placement is acceptable. In the depicted embodiment of method 150, a clock tree is synthesized (block 154) using a conventional clock tree synthesis algorithm or application based on the positions of the various objects as determined by the initial placement algorithm. The signal skew of the synthesized clock tree is then determined (block 156). In some embodiments, the clock tree synthesizer reports clock skew automatically while, in other embodiments, skew is determined by simulating the synthesized clock tree.

If the initial placement algorithm generates a placement exhibiting a signal skew that is within an acceptable tolerance or threshold (block 158), additional placement processing is unnecessary and the global placement procedure is terminated. In the event that the initial placement algorithm generates excessive clustering or placement asymmetry of the latched objects resulting in a clock tree with unacceptably high signal skew, a second global placement algorithm is executed (block 160). In one embodiment, the second placement algorithm resolves object placement subject to constraints on the amount of latched object asymmetry allowable as quantified by some maximum deviation between the latched object center of mass values and the overall center of mass values. In the embodiment described above, for example, the second placement algorithm is executed to resolve equation 101 subject to the constraints of equations 111A and 111B. As described above, the resolution of equation 101 subject to the constraints of equations 111A and 111B achieves desirable interconnect minimization (clock signal delay minimization) while also achieving improved (reduced) latched object clustering.

Following the execution and resolution of the second placement algorithm, a clock tree is synthesized based on the placement determined by the second placement algorithm (block 162) and the resulting signal skew determined (block 164). If the signal skew of the newly constructed clock tree is still unacceptably high (block 166), the placement method is aborted with an error message (block 170). If the second algorithm successively resolves the placement problem with acceptable signal skew characteristics, the global placement process is complete.

It will be apparent to those skilled in the art having the benefit of this disclosure that the present invention contemplates a mechanism for globally placing objects in an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of designing an integrated circuit, comprising executing a placement algorithm to place a set of objects within the integrated circuit, wherein the set of objects includes latched objects and non-latched objects and wherein the algorithm places objects to minimize clock signal delay subject to a constraint on the placement distribution of the latched objects relative to the placement distribution of the non-latched objects; and wherein the latched object and non-latched object placement constraints limit the difference between the latched object center of mass and a non-latched object center of mass, wherein the latched object center of mass equals a sum of size-location products for each latched object divided by the sum of sizes for each latched object.

2. The method of claim 1, wherein the constraints require that the latched object center of mass and the non-latched center of mass both equal the center of mass for all objects.

3. The method of claim 1, wherein the algorithm minimizes clock signal delay by minimizing, subject to the placement constraint, a weighted sum of lengths of interconnects required to connect the objects as placed.

4. The method of claim 3, further comprising performing an unconstrained initial placement algorithm to place the latched and non-latched objects to minimize the sum of interconnect lengths.

5. The method of claim 4, further comprising:

synthesizing a clock tree for the objects as placed and for determining signal skew associated with the clock tree; and invoking the placement algorithm responsive to the determined signal skew exceeding a threshold value.

6. A computer program product for designing an integrated circuit, the program product being stored on a computer readable medium, comprising code means for performing a placement algorithm to place a set of objects within the integrated circuit, wherein the set of objects includes latched objects and non-latched objects and wherein the algorithm places objects to minimize clock signal delay subject to a constraint on latched object placement limiting the extent of latched placement asymmetry:

wherein the algorithm places objects subject to an additional constraint on non-latched object placement limiting the extent of non-latched placement asymmetry;

wherein the latched object and non-latched object placement constraints limit the difference between the latched object center of mass and a non-latched object center of mass, wherein the latched object center of mass equals a sum of size-location products for each latched object divided by the sum of sizes for each latched object.

7. The computer program product of claim 6, wherein the constraints require that the latched object center of mass and the non-latched center of mass both equal the center of mass for all objects.

8. The computer program product of claim 6, wherein the algorithm minimizes clock signal delay by minimizing, subject to the placement constraint, a weighted sum of lengths of interconnects required to connect the objects as placed.

9. The computer program product of claim 8, further comprising:
code means for performing an unconstrained initial placement algorithm to place the latched and non-latched objects to minimize the sum of interconnect lengths.

10. The computer program product of claim 9, further comprising:
code means for synthesizing a clock tree for the objects as placed and for determining signal skew associated with the clock tree; and
code means for invoking the placement algorithm responsive to the determined signal skew exceeding a threshold value.

11. A system for designing an integrated circuit, comprising means for executing a placement algorithm to place a set of objects within the integrated circuit, wherein the set of objects includes latched objects and non-latched objects and wherein the algorithm places objects to minimize clock signal delay subject to a constraint on the placement distribution of the latched objects relative to the placement distribution of the non-latched objects;
wherein the latched object and non-latched object placement constraints limit the difference between the latched object center of mass and a non-latched object center of mass, wherein the latched object center of mass equals a sum of size-location products for each latched object divided by the sum of sizes for each latched object.

12. The system of claim 11, wherein the constraints require that the latched object center of mass and the non-latched center of mass both equal the center of mass for all objects.

13. The system of claim 11, wherein the algorithm minimizes clock signal delay by minimizing, subject to the placement constraint, a weighted sum of lengths of interconnects required to connect the objects as placed.

14. The system of claim 13, further comprising means for performing an unconstrained initial placement algorithm to place the latched and non-latched objects to minimize the sum of interconnect lengths.

15. The system of claim 14, further comprising
means for synthesizing a clock tree for the objects as placed and for determining signal skew associated with the clock tree; and
means for invoking the placement algorithm responsive to the determined signal skew exceeding a threshold value.

16. The system of claim 11, wherein the constraint on the placement distribution of the latched objects is further characterized as a constraint on the x-axis placement distribution and the y-axis placement distribution of latched objects relative to the x-axis and y-axis placement distribution of the non-latched objects.

* * * * *